United States Patent
Barowski et al.

(10) Patent No.: US 8,421,500 B2
(45) Date of Patent: Apr. 16, 2013

(54) INTEGRATED CIRCUIT WITH STACKED COMPUTATIONAL UNITS AND CONFIGURABLE THROUGH VIAS

(75) Inventors: Harry S. Barowski, Boebliingen (DE); Tim Niggemeier, Laatzen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/952,365

(22) Filed: Nov. 23, 2010

(65) Prior Publication Data
US 2011/0131391 A1 Jun. 2, 2011

(51) Int. Cl.
*H03K 19/177* (2006.01)

(52) U.S. Cl.
USPC .............................................. 326/40; 326/38

(58) Field of Classification Search .................. None
See application file for complete search history.

(56) References Cited

U.S. PATENT DOCUMENTS

| | | | |
|---|---|---|---|
| 7,075,175 B2 * | 7/2006 | Kazi et al. ................... | 257/678 |
| 7,157,787 B2 | 1/2007 | Kim et al. | |
| 7,518,398 B1 * | 4/2009 | Rahman et al. ................ | 326/38 |
| 7,526,739 B2 | 4/2009 | McIlrath | |
| 7,973,555 B1 * | 7/2011 | Trimberger et al. ........... | 326/38 |
| 2004/0178819 A1 * | 9/2004 | New ............................... | 326/40 |
| 2007/0152708 A1 * | 7/2007 | Madurawe et al. ............ | 326/39 |
| 2008/0150088 A1 | 6/2008 | Reed et al. | |
| 2008/0258309 A1 | 10/2008 | Chiou et al. | |
| 2009/0103345 A1 | 4/2009 | McLaren et al. | |
| 2009/0161402 A1 | 6/2009 | Oh et al. | |
| 2011/0012633 A1 * | 1/2011 | Rahman et al. .......... | 324/754.07 |
| 2011/0108972 A1 * | 5/2011 | Foster et al. .................. | 257/686 |

* cited by examiner

*Primary Examiner* — Crystal L Hammond
(74) *Attorney, Agent, or Firm* — Yudell Isidore Ng Russell PLLC

(57) ABSTRACT

A technique for manufacturing a three-dimensional integrated circuit includes stacking a memory unit on a first die that includes a first computational unit. In this case, the memory unit is included in a second die. A second computational unit that is included in a third die is stacked on the second die. Sets of vertical vias that extend through the first, second, and third dies are connected to connect components of the first and second computational units and the memory unit. Multiplexers of the first and second computational units are configured to selectively couple the components to different ones of the sets of vertical vias responsive to respective control words for each of the first and third dies.

23 Claims, 9 Drawing Sheets

INTEGRATED CIRCUIT WITH STACKED COMPUTATIONAL UNITS AND CONFIGURABLE THROUGH VIAS

This application claims priority to European Patent Application No. EP 09177482, entitled "INTEGRATED CIRCUIT WITH STACKED COMPUTATIONAL UNITS," by Tim Niggemeier et al., filed Nov. 30, 2009, the disclosure of which is hereby incorporated herein by reference in its entirety.

BACKGROUND

1. Technical Field

The present invention generally relates to an integrated circuit and in particular to an integrated circuit with stacked computational units and configurable through vias.

2. Description of the Related Art

Traditionally, designers of integrated circuits (chips) with multiple computational units have distributed the computational units in a same horizontal plane of a chip and have connected the computational units to each other using buses. However, as the number of computational units in conventional chip designs has increased, a footprint of an associated chip and a bus length of buses that connect the computational units to each other has also increased. In general, increasing a footprint of a chip increases a cost of the chip. Moreover, increasing bus lengths in a chip increases bus transmission delays, which may limit system performance.

In an attempt to address the footprint and transmission delay issues associated with conventional chips, chip designers have designed three-dimensional (3D) chips in which two or more layers of active electronic components are integrated vertically and horizontally in a single chip. According to a conventional die-on-die manufacturing technology that has been employed to build 3D chips, electronic components are built on multiple die that are aligned and bonded to form a 3D chip. At least some 3D chips have employed through silicon vias (TSVs) that pass through a die between active layers and/or between an active layer and an external bond pad. According to the conventional die-on-die manufacturing technology, TSV creation can be performed before or after dies are bonded. However, when a via included in a bus (i.e., a set of vias) of a chip manufactured according to the conventional die-on-die manufacturing technology is open, the chip is usually scrap.

BRIEF SUMMARY

Disclosed are a method for forming an integrated circuit (chip) with stacked computational units and configurable through vias, a data processing system that includes the chip, and the chip.

A technique for manufacturing a three-dimensional integrated circuit includes stacking a memory unit on a first die that includes a first computational unit. In this case, the memory unit is included in a second die. A second computational unit that is included in a third die is stacked on the second die. Sets of vertical vias that extend through the first, second, and third dies are connected to connect components of the first and second computational units and the memory unit. Multiplexers of the first and second computational units are configured to selectively couple the components to different ones of the sets of vertical vias responsive to respective control words for each of the first and third dies.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

The above as well as additional objectives, features, and advantages of the present invention will become apparent in the following detailed written description.

BRIEF DESCRIPTION OF THE DRAWINGS

The description of the illustrative embodiments is to be read in conjunction with the accompanying drawings, wherein.

DETAILED DESCRIPTION

Figure 1:
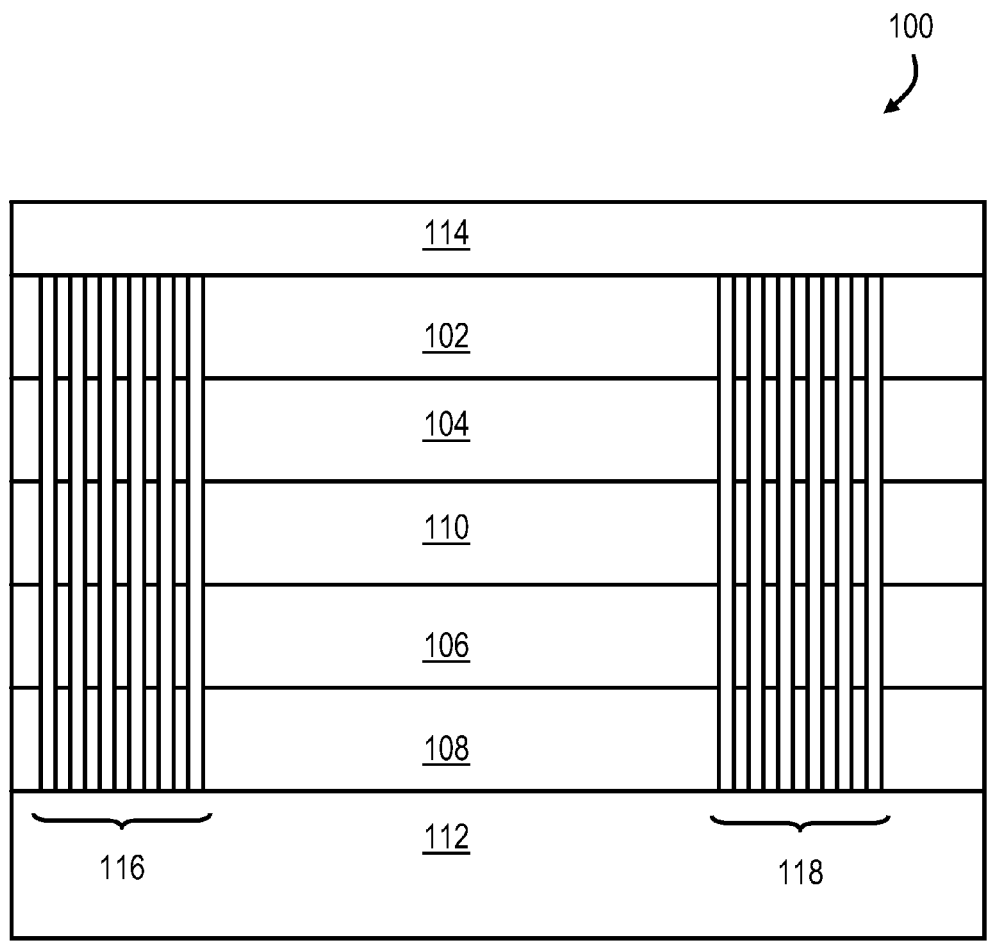
FIG. 1 is a diagram of a relevant portion of an integrated circuit (chip) configured according to the present disclosure to include configurable through vias.

The illustrative embodiments provide a method for forming an integrated circuit (with stacked computational units and configurable through vias), a data processing system that includes the integrated circuit, and the integrated circuit. While the discussion herein is primarily directed to connecting computational units to a memory unit using configurable vias, it should be appreciated that the techniques disclosed herein are broadly applicable to connecting units in different layers of a three-dimensional (3D) chip using configurable vias.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

It is understood that the use of specific component, device and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. As used herein a 'via' is as an opening in an insulating layer that is filled with an electrically conductive material (e.g., copper or aluminum) that creates an electrical connection between layers in an integrated circuit (chip). For example, a via may be constructed using a single or double damascene process.

In a chip with multiple computational units, it may be desirable to split a calculation between the multiple computational units. In this case, a set of vias may be used to send and receive instructions between the computational units. For example, a set of vias may be used to pass a result of one calculation from a first computational unit to a second computational unit. In general, stacking computational units on each other advantageously reduces an electrical connection length between the computational units which usually allows the computational units to operate at a higher speed.

According to the present disclosure, techniques for facilitating adaptive and programmable data distribution for three-dimensional (3D) chips that include multiple computational units (e.g., single-instruction multiple-data (SIMD) units) is disclosed. In general, building a 3D chip requires connecting several stacked dies with vertical vias. Typically, employing through vias is less complex and is usually preferred to only interconnecting adjoining dies. For data distribution in stacked SIMD units, several hundred vias may be required (e.g., for a one vector pipeline with three source operands, one target, four slices, and thirty-two bits per slice, five-hundred twelve vias are required). Traditionally, creating vias between units during manufacturing is a critical process as open vias reduce chip yield. When developing stacked SIMD units, one way to gain benefits by shorter data paths is to vertically stack several identical computation pipelines (e.g., the four slices of a four-way vector unit) on top of each other.

According to one or more embodiments of the present disclosure, all data paths are implemented through all units (dies or layers) and each unit receives an individual identification (ID) that may be hardcoded when the units are stacked. In one or more embodiments, after first power-on, each computational unit employs a built-in self test (BIST) circuit to test the connections of all data paths to a memory unit that includes, for example, a register file. If a via in a data path is broken, a computational unit swaps the data path with another computational unit and re-runs the test. When a solution is found where all of the computational units can communicate over a data path with the memory unit, the configuration is stored in fuses. In this case, a multiplexing structure is implemented to bypass open connections.

According to various embodiments of the present disclosure, stacking computational units achieves high performance designs with shorter wires, reduced area, higher density, lower latencies, smaller packages, and higher yield. For superscalar microprocessors, identical units may be stacked above each other using identical layouts and a memory structure may placed in a middle layer to reduce wire distances and lower capacitance, noise, and cross-talk. For SIMD units, identical layers may be stacked above each other and a register file/array structure may be positioned in a middle layer.

During assembly, each layer may be tested before stacking to improve yield and unique IDs may be assigned to a layer to reflect a physical position of the layer in the stack (i.e., which set or sets of vias allow a unit to communicate with another unit). In general, creating vias through an entire stack (as contrasted with only connecting neighboring layers) is cheaper and faster. In various embodiments, vias are assigned to units after stacking as all vias are implemented through all layers. In one or more embodiments, each layer is assigned an individual ID that is hardcoded at or prior to stacking.

A computational unit may take the form of a processor adapted for executing machine executable instructions and may be referred to as a processor, a processor core, or a processor unit herein. The computational units may be, for example, central processing units (CPUs), floating point units (FPUs), arithmetic logic units (ALUs), or SIMD units, which are adapted for applying the same instructions to a large number of data points and are commonly used for processing in multimedia applications. The chip may be a central processing unit (i.e., a chip that includes one or more processor cores adapted for executing machine executable instructions), a digital signal processor, or a graphic processing unit.

In one or more embodiments, vias are grouped in a set and each set of vias has an electrical connection to all of the computational units. As noted above, a chip configured according to the present disclosure is configured to determine a subset of the set of vias for each of the computational units using an identification code of each of the computational units. In one or more embodiments, the identification code identifies which vias are used for communicating with a particular computational unit. For example, an identification code may be a code that identifies a unique set of vias. The identification code may be used to address each computational unit and may be used to set internal values in the computational unit which uniquely identify which of the vias belongs to the set of vias that are associated with the computational unit. In various embodiments, each of the computational units is configured to pass messages to any other of the computational units using a subset of the set of vias.

In one or more embodiments, all of the vias are divided into groups of vias which are mutually exclusive. That is, a via is a member of a set of vias and is not a member of another set of vias. In this case, vias are divided into groups which are associated with particular computational units. In another embodiment, a particular via may belong to more than one set of vias. In this case, a set of vias can be used to form a bus that is used to communicate between one or more of the computational units. In this manner, multiplexing schemes may be used to communicate across layers and between computational units using a set or multiple sets of vias. In various embodiments, a chip is configured to test for a broken connection for each of the set of vias. A particular via may be formed by an inter-layer contact which connects two adjacent layers. In this case, a collection of inter-layer contacts that are constructed on top of each other form a via. It should be appreciated that when there is a broken or bad electrical connection at any point along a via, the via cannot be used to communicate a signal between all of the computational units.

As noted above, a broken connection may be detected by incorporating test circuitry into each of the layers. Alternatively, layers with computational units may employ a program (e.g., in the form of machine executable instructions) to test each of the vias to see if there are any broken connections. For example, each layer may test communications along each of the vias and the identification code may be used to address the computational units during the test. In one or more embodiments, a chip is configured to bypass broken connections by setting identification codes of computational units to select sets of vias for each of the computational units. For example, if a chip includes four layers and one layer is not able to communicate due to a broken via, sets of vias may be reassigned from one layer to another layer to allow all of the four layers to communicate and, in this manner, increase manufacturing yield as the broken connection is bypassed.

In one or more embodiments, a chip is tested for a broken connection and the identification code of at least one of the computational units is set after manufacture. In other embodiments, a chip is tested for broken connections following manufacture and the identification code is set after manufacture. In one or more embodiments, an identification code for each computational unit included in a chip is set when the chip is connected to electrical power. In this embodiment, when power is applied to the chip (or alternatively when an instruction is sent to the chip to self-test), the chip tests for a broken connection for each set of vias and then uses the results of the test to set identification codes for the computational units to bypass broken connections (if possible). In this embodiment, if a via opens during a useful life of a chip, the open via may not necessarily result in failure of the chip.

In another embodiment, an identification code for each computational unit of a chip is hardwired during manufacture. For example, different masks may be used to manufacture each of the layers. Alternatively, a laser may be used to burn connections to set a unique identification code for each of the computational units during manufacture. The mask may also be designed such that the same mask is used for each of the computational units but the layer stacking process sets the identification code. That is, vias can be connected between layers in such a way that the connection of vias between layers sets the identification code. If the identification code is hardwired, additional memory may be implemented within the chip to define the set of vias for each of the computational units.

In various embodiments, each of the computational units is adapted for communicating with a set of vias using multiplexing. In one or more embodiments, the set of vias form buses which facilitate communication between the various layers. The identification code may be used by the multiplexers to determine which of the vias is used by a first computational unit to send a message to a second computational unit. The computational units may have an identical layout (i.e., a same mask may be used for manufacturing each of the computational units). In one or more embodiments, a chip also includes a memory unit, e.g., a register file. Register files are typically implemented by using fast static RAM and usually have dedicated read and write ports. In this embodiment, the set of vias connect the register file to each of the computational units and each of the computational units is adapted for communicating with the register file using an assigned subset of the set of vias.

In another embodiment, each subset of the vias is divided into a send group and a receive group. The send group of each subset is used for sending data and the receive group is used for receiving data. The send group and the receive group are determined by the identification code, which may be an address that identifies the send group and the receive group. The identification code may be used to control a multiplexer to specify vias or in conjunction with a memory to identify a send group and a receive group. In another embodiment, each computational unit is adapted for self-assigning an identification code. In this embodiment, the identification code for each layer may be determined by a computational unit in the layer or by specialized circuitry in the layer. In this embodiment, each layer tests the individual vias or groups of vias to detect broken connections. Using the detected broken connection(s), an identification code is determined (when possible) to allow the computational unit to communicate with the other computational units and avoid using the broken connection(s). In another embodiment each of the computational units are functionally identical. When the computational units are functionally identical, sets of vias for the computational units in different layers may be logically shifted using the identification code. For example, if there are any broken connections in the set of vias, the identification code may be set such that the integrated circuit is used in a way that bypasses any broken connections.

With reference to FIG. 1, a relevant portion of an exemplary chip 100 includes multiple layers (dies) that include computational units (e.g., single instruction multiple data (SIMD) units) 102, 104, 106, and 108 and memory unit (e.g., a register file) 110. As is illustrated, the layers that include computational units 102, 104, 106, and 108 and memory unit 110 are stacked on substrate 112. A global wiring layer 114 forms electrical connections between different functional blocks of chip 100. As is shown, the layer that includes computational unit 108 is formed directly on substrate 112 and the layer that includes computational unit 106 is stacked directly on the layer that includes computational unit 108. The layer that includes memory unit 110 is stacked directly on the layer that includes computational unit 106 and the layer that includes computational unit 104 is stacked directly on the layer that includes memory unit 110. The layer that includes computational unit 102 is stacked directly on the layer that includes computational unit 104 and global wiring layer 114 is formed directly on the layer that includes computational unit 102. As is also illustrated, physical vias 116 and 118 are formed through the layers that include computational units 102, 104, 106, and 108 and memory unit 110. For example, a single or dual damascene process may be used to form physical vias 116 and 118.

Figure 2:
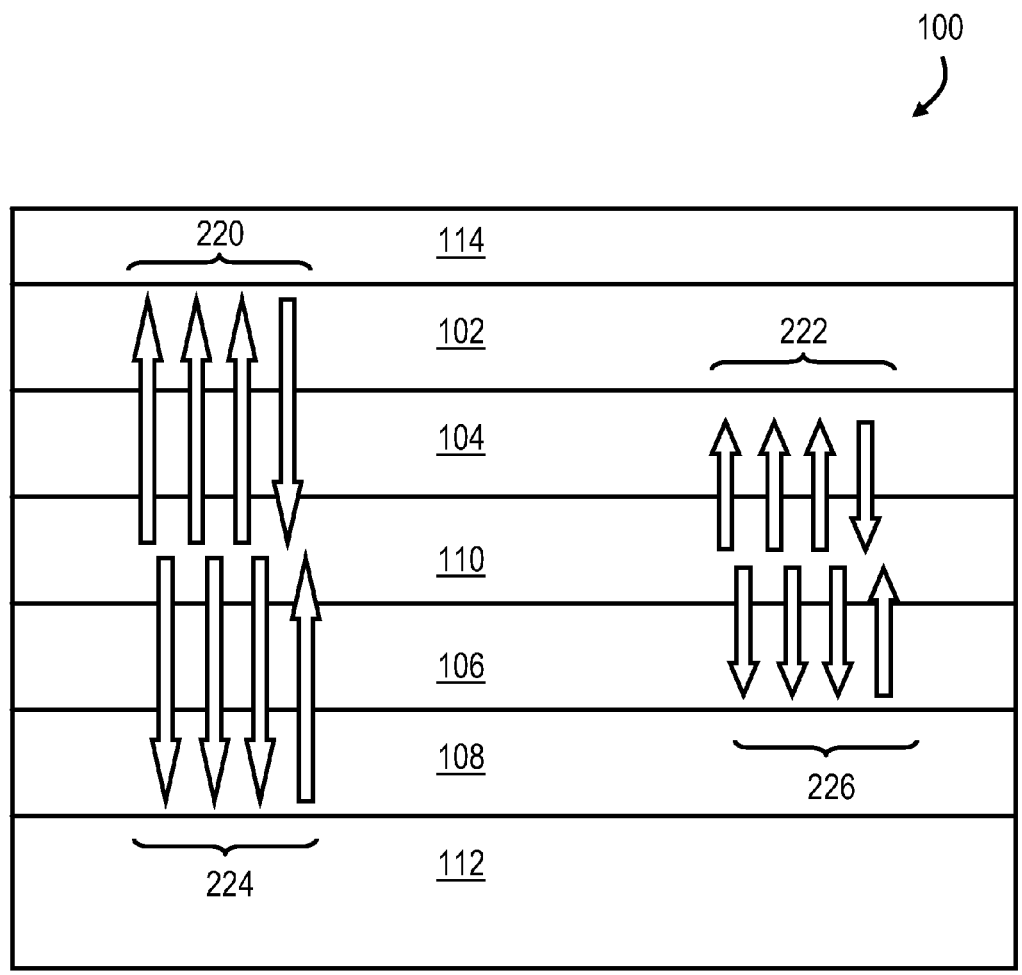
FIG. 2 is a diagram of a relevant portion of the chip of FIG. 1 illustrating exemplary logical connections between dies (layers) of the chip in accordance with various embodiments of the present disclosure.

With reference to FIG. 2, chip 100 is illustrated with logical connections 220, 222, 224, and 226 that are provided between the various layers, as contrasted with physical vias 116 and 118. That is, exemplary logical connections (achieved using physical vias 116 and 118) between memory unit 110 and computational units 102, 104, 106, and 108 are shown instead of physical vias 116 and 118. Logical connections 220 represent connections (achieved using physical vias 116) between memory unit 110 and computational unit 102 and logical connections 222 represent connections (achieved using physical vias 118) between memory unit 110 and computational unit 104. Logical connections 224 represent connections (achieved using physical vias 116) between memory unit 110 and computational unit 108 and logical connections 226 represent connections (achieved using physical vias 118) between memory unit 110 and computational unit 106. It should be appreciated that since physical vias 116 and 118 of chip 100 are all intact, a number of other logical connections can be employed to connect computational units 102, 104, 106, and 108 to memory unit 110.

Figure 3:
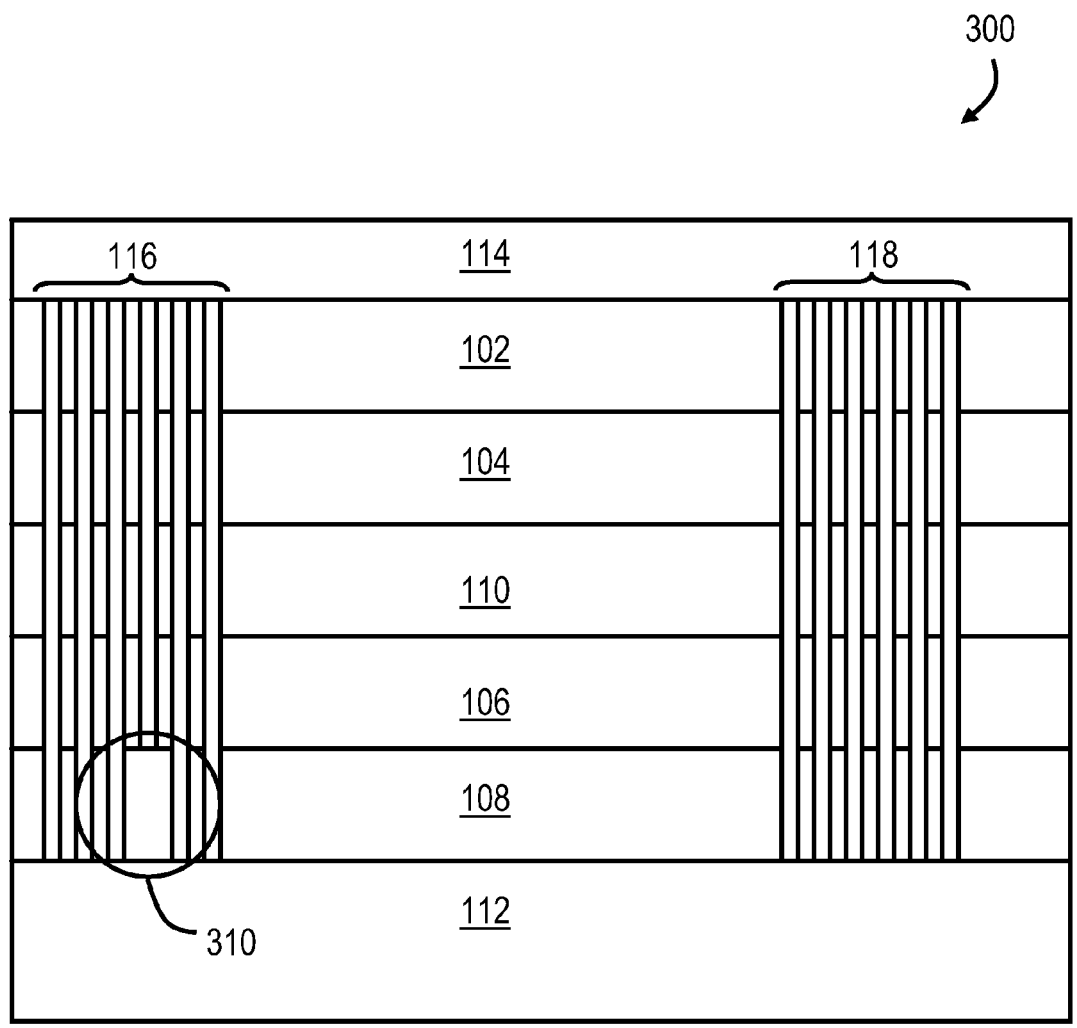
FIG. 3 is a diagram of a relevant portion of another chip configured according to the present disclosure to include configurable through vias, at least one of which is defective.

With reference to FIG. 3, a relevant portion of an exemplary chip 300 includes multiple layers (dies) that include computational units (e.g., SIMD units) 102, 104, 106, and 108 and memory unit (e.g., a register file) 110. As is illustrated, the layers that include computational units 102, 104, 106, and 108 and memory unit 110 are stacked on substrate 112. A global wiring layer 114 forms electrical connections between different functional blocks of chip 300. As is illustrated, the layer that includes computational unit 108 is formed directly on substrate 112 and the layer that includes computational unit 106 is stacked directly on the layer that includes computational unit 108. The layer that includes memory unit 110 is stacked directly on the layer that includes computational unit 106 and the layer that includes computational unit 104 is stacked directly on the layer that includes memory unit 110. The layer that includes computational unit 102 is stacked directly on the layer that includes computational unit 104 and global wiring layer 114 is formed directly on the layer that includes computational unit 102. As is also illustrated, physical vias 116 and 118 are formed through the layers that include computational units 102, 104, 106, and 108 and memory unit 110. Chip 300, while similar to chip 100 of FIG. 1, differs from chip 100 in that an open (broken connection) 310 exists in physical vias 116 of chip 300.

Figure 4:
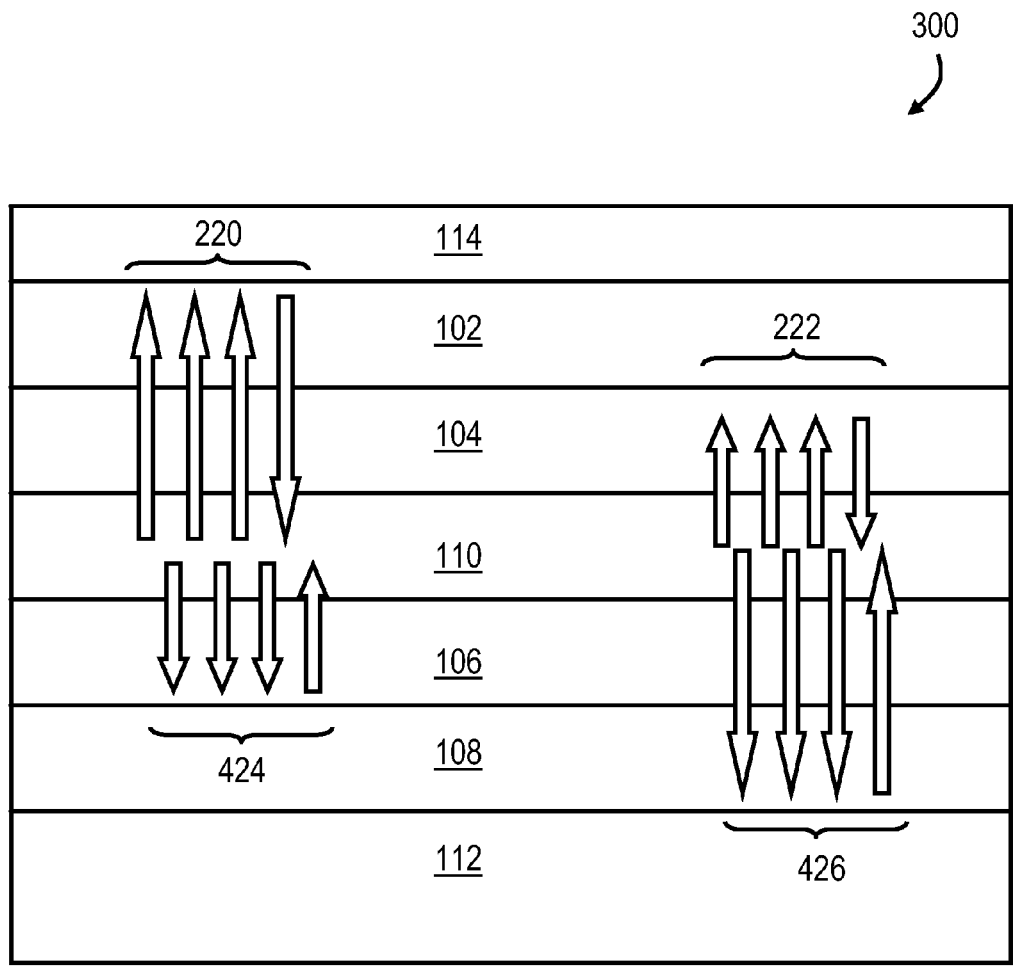
FIG. 4 is a diagram of a relevant portion of the chip of FIG. 3 illustrating exemplary logical connections between dies of the chip in accordance with various embodiments of the present disclosure.

With reference to FIG. 4, logical connections 424 and 426 (achieved using physical vias 116 and 118) are provided between the various layers to address open 310 in physical vias 116 of chip 300. More specifically, logical connections 424 have replaced logical connections 224 and logical connections 426 have replaced logical connections 226 to address open 310 in physical vias 116 of chip 300. In FIG. 4, logical connections 220 still represent connections (achieved using physical vias 116) between memory unit 110 and computational unit 102 and logical connections 222 still represent connections (achieved using physical vias 118) between memory unit 110 and computational unit 104. However, logical connections 424 represent connections (achieved using physical vias 116) between memory unit 110 and computational unit 106 and logical connections 426 represent connections (achieved using physical vias 118) between memory unit 110 and computational unit 108. It should be appreciated that even though physical vias 116 of chip 300 includes open 310, other logical connections can be employed to connect computational units 102 and 104 to memory unit 110 using physical vias 116 and 118.

In FIGS. 1-4 exemplary communications between register file 110 and computational units 102, 104, 106, and 108 are illustrated. Many of the techniques disclosed herein are applicable to direct communication between computational units, with or without communication between the computational units and a memory unit. For example, logical connections may also be formed between different computational units 102, 104, 106, and 108. In FIGS. 1-4, memory unit 110 is illustrated as being included in a layer sandwiched between layers including computational units 102, 104, 106, and 108 to provide an arrangement where a distance between computational units 102, 104, 106, and 108 and memory unit 110 is minimized. It is contemplated that the techniques disclosed herein are applicable to chips which do not include a memory unit and to chips in which a memory unit (or memory units) is positioned in a different position in a chip stack.

Figure 5:
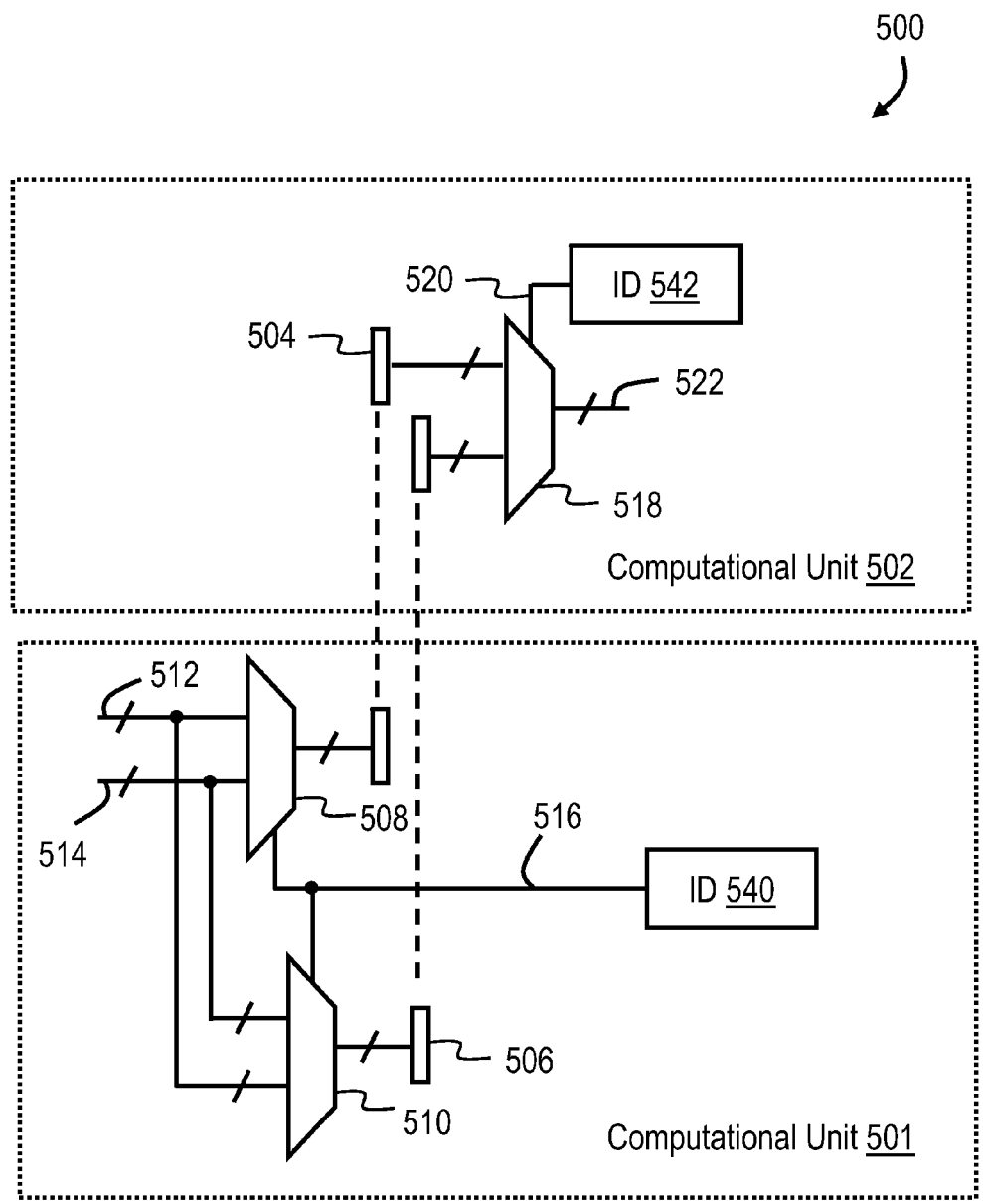
FIG. 5 is a diagram of a relevant portion of an exemplary multiplexing structure that facilitates configuration of through vias to reduce chip scrap due to defective vias.

With reference to FIG. 5, diagram 500 illustrates how multiplexers may be implemented to facilitate communication between two computational units over different buses that include multiple vias. For example, a first bus may be chosen for communication between two computational units when a second bus has an open that prevents communication between the two computational units. Specifically, send multiplexers 508 and 510 and receive multiplexer 518 may be controlled to select which set of vias are used to communicate between computational units 501 and 502. In FIG. 5, computational unit 501 is located in a first layer (die) and computational unit 502 is located in a second layer (die), which may or may not be adjacent to the first layer. As is shown, a first set of vias forms bus 504 and a second set of vias forms bus 506. In one or more embodiments, buses 504 and 506 each include multiple vias. Multiplexers 508, 510, and 518 are used to select whether bus 504 or bus 506 is used to send a message from computational unit 501 to computational unit 502. As is shown, send multiplexers 508 and 510 are included in computational unit 501.

An 'A' input 512 and a 'B' input 514 are connected to respective inputs of send multiplexers 508 and 510. A multiplexer control 516 select inputs of multiplexers 508 and 510 and controls whether send multiplexer 508 or send multiplexer 510 sends a message from computational unit 501 to computational unit 502. Bus 504 is connected to outputs of send multiplexer 508 and bus 506 is connected to outputs of send multiplexer 510. Computational unit 502 includes receive multiplexer 518, whose multiplexer control 520 is used to select whether bus 504 or bus 506 is utilized to receive a message from computational unit 501. The vias of bus 504 and the vias of bus 506 are both connected to different inputs of receive multiplexer 518. Outputs 522 of receive multiplexer 518 provide a message (from computational unit 501) to computational unit 502. Select inputs to multiplexer control 516 and multiplexer control 520 may, for example, be determined by respective identification codes 540 and 542 (or portions thereof which may be encoded in fuses) for computational units 501 and 502.

Figure 6:
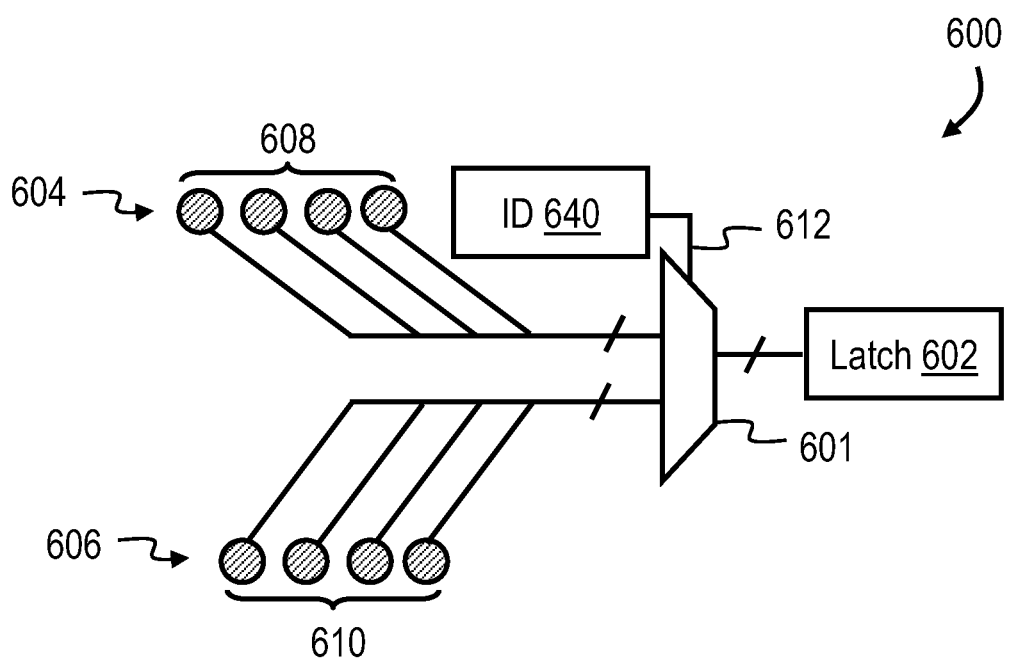
FIG. 6 is a diagram of a relevant portion of another exemplary multiplexing structure that facilitates configuration of through vias to reduce chip scrap due to defective vias.

With reference to FIG. 6, diagram 600 illustrates how a multiplexer 601 (e.g., implemented within a computational unit) may be used to select a set of vias to communicate between computational units. As is shown, an output of multiplexer 601 is coupled to an input of latch 602 (e.g., a flip-flop or a memory register). A first bus 604 and a second bus 606 are connected to respective inputs of multiplexer 601. Bus 604 includes a first set of vias 608 and bus 606 includes a second set of vias 610. Multiplexer 601 includes a multiplexer control 612 that receives an identification code 640, which may be stored in a fuse. Identification code 640 selects whether bus 604 or bus 606 is used for communicating between computational units.

Figure 7:
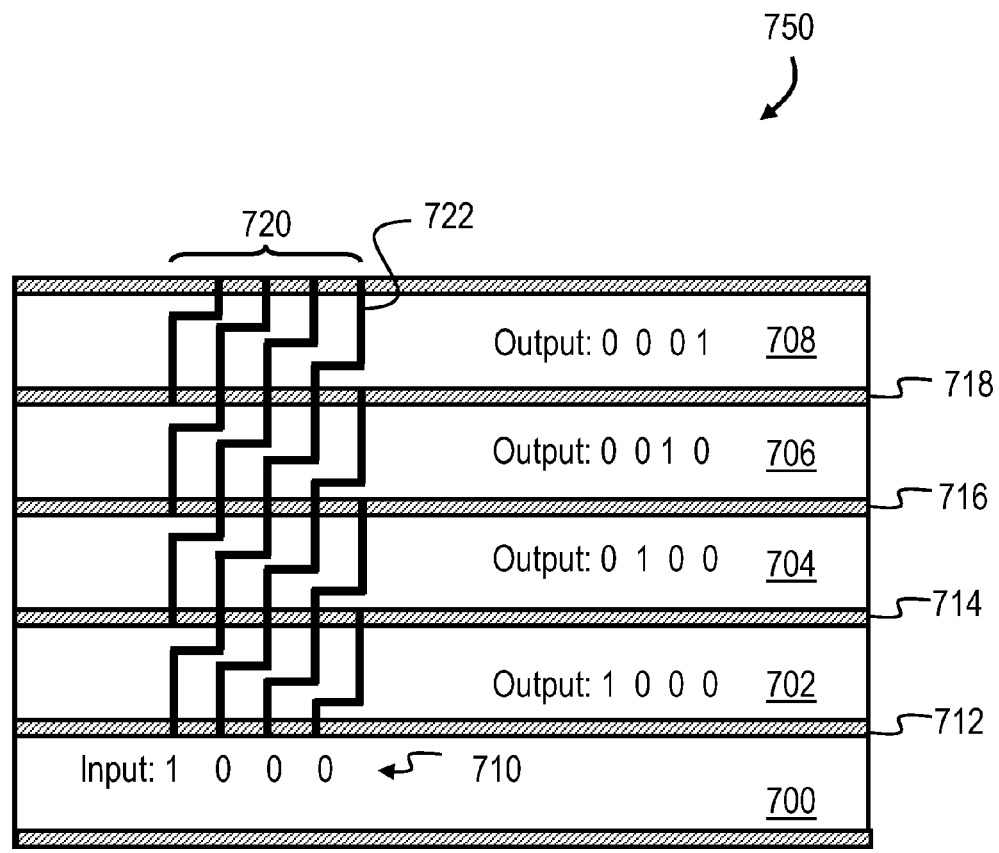
FIG. 7 is a diagram of a relevant portion of a chip whose identification code is hardwired.

With reference to FIG. 7, a relevant portion of a chip 750 is illustrated that includes computational units with hardwired identification codes. Chip 750 includes multiple layers 700, 702, 704, 706, and 708 that each include respective computational units and are identical. A layer 702 is stacked on a main layer 700. A layer 704 is stacked on layer 702 and a layer 706 is stacked on layer 704. Finally, a layer 708 is stacked on layer 706. Main layer 700 has an input 710 which is configured to receive a digital signal. Layer 702 includes an output 712, layer 704 includes an output 714, layer 706 includes an output 716, and layer 708 includes an output 718. Layers 702, 704, 706, and 708 are identical and include a set of vias 720 which connect adjacent layers. However, vias 720 have horizontal components and do not connect vertical vias together. In main layer 700, a signal '1000' is input into vias 720 to set identification codes for layers 702, 704, 706, and 708. Via 722 is connected through each layer 702, 704, 706, and 708 to the value of '1' and, as such, has a high value. In this case, output 712 for layer 702 has a value of '1000' and output 714 of layer 704 has a value of '0100'. Additionally, output 716 of layer 706 has a value of '0010' and output 718 of layer has a value of '0001'. In this embodiment, hardwired identification codes of layers 702, 704, 706, and 708 are unique and are set by input 710.

Figure 8:
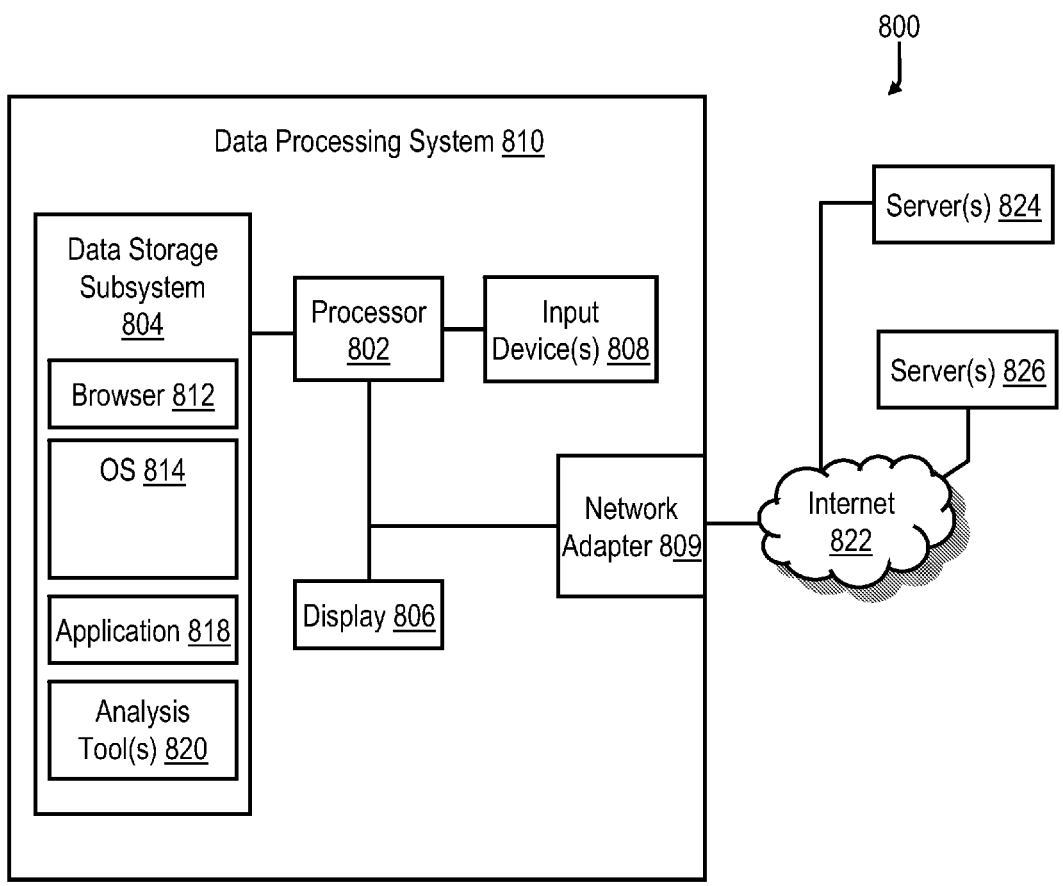
FIG. 8 is a diagram of a relevant portion of an exemplary data processing environment that includes a data processing system with a chip configured according to the present disclosure.

With reference to FIG. 8, an exemplary data processing environment 800 is illustrated that includes a data processing system 810 that includes one or more chips that are configured according to one or more embodiments of the present disclosure. Data processing system 810 may take various forms, such as servers, workstations, laptop computer systems, notebook computer systems, or desktop computer systems and/or clusters thereof. Data processing system 810 includes a processor 802 (which may include one or more processor cores for executing program code that are included in a chip that is configured according to the present disclosure) coupled to a data storage subsystem 804. Data storage subsystem 804 may include, for example, application appropriate amounts of various memories (e.g., dynamic random access memory (DRAM), static RAM (SRAM), and read-only memory (ROM)), and/or one or more mass storage devices, such as magnetic or optical disk drives. Data storage subsystem 804 includes an operating system (OS) 814 for data processing system 810, as well as application programs, such as a browser 812 (which may optionally include customized plug-ins to support various client applications), analysis tool(s) 820 (which may include, for example, verification, simulation, and/or synthesis tools), and other applications (e.g., a word processing application, a presentation application, and an email application) 818.

Data processing system 810 further includes a display 806, input device(s) 808 (for example, a mouse, a keyboard, haptic devices, and/or a touch screen), and a network adapter 809. Network adapter 809, which supports communication utilizing one or more communication protocols, such as 802.x, HTTP, simple mail transfer protocol (SMTP), etc. is coupled via one or more wired or wireless networks, such as the Internet 822, to various data processing systems, such as servers 824 and 826.

Those of ordinary skill in the art will appreciate that the hardware components and basic configuration depicted in FIG. 8 may vary. The illustrative components within data processing system 810 are not intended to be exhaustive, but rather are representative to highlight components that may be utilized to implement the present invention. For example, other devices/components may be used in addition to or in place of the hardware depicted. The depicted example is not meant to imply architectural or other limitations with respect to the presently described embodiments.

Figure 9:
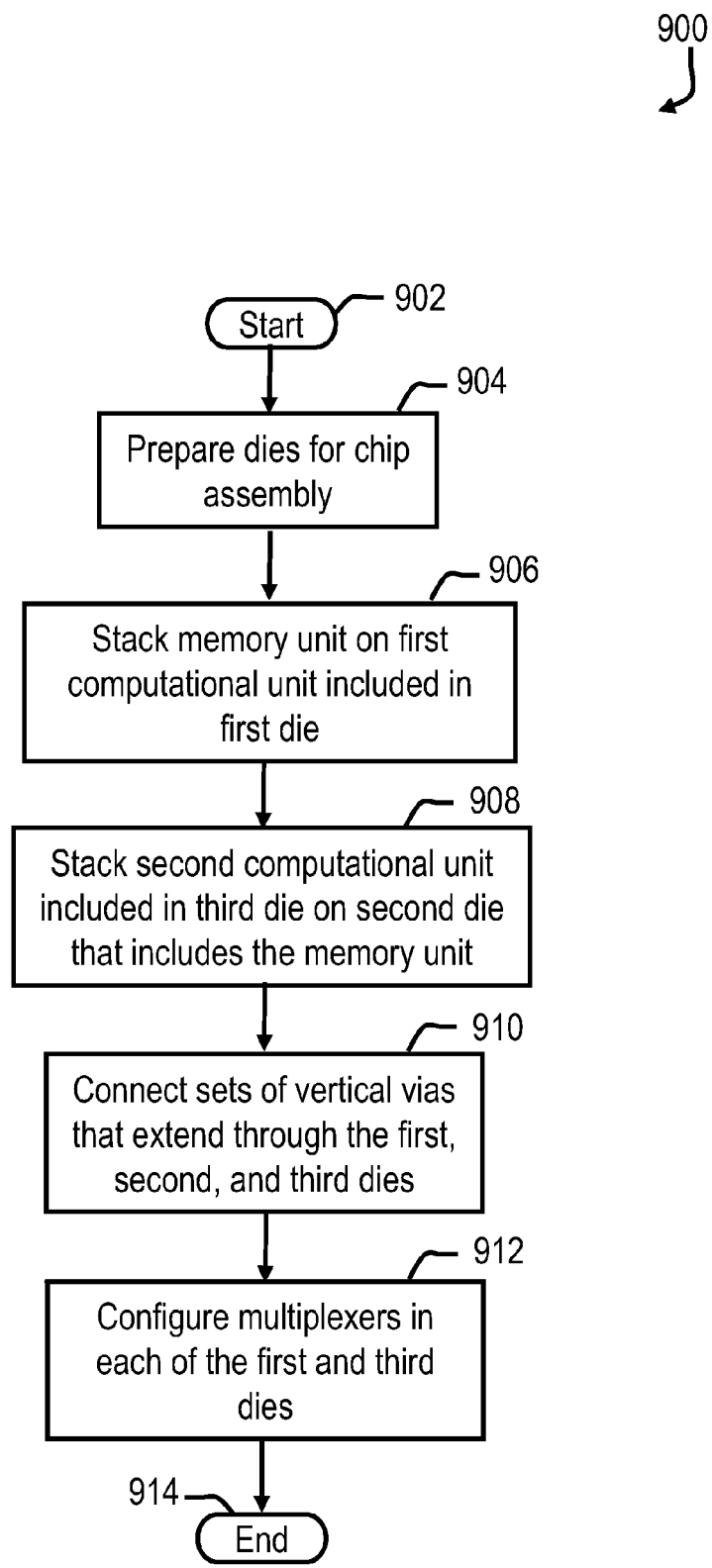
FIG. 9 is a flow chart for an exemplary process to manufacture a chip according to an embodiment of the present disclosure.

With reference to FIG. 9, a flow chart for an exemplary process 900 for manufacturing an integrated circuit (chip) according to the present disclosure is illustrated. At block 902 the process is initiated and in block 904 dies are prepared for chip assembly (i.e., appropriate computational and memory units are fabricated in the dies). Next, in block 906, a memory unit is stacked on a first computational unit that is included in a first die. In this case, the memory unit is included in a second die. Then, in block 908, a second computational unit that is included in a third die is stacked on the second die. Next, in block 910, sets of vertical vias that extend through the first, second, and third dies are connected to connect components of the first and second computational units and the memory unit. Finally, in block 912, multiplexers in the first and third dies are configured (e.g., according to continuity tests) to selectively couple the components to different ones of the sets of vertical vias responsive to respective control words for each of the first and third dies. Following block 912, process 900 ends at block 914.

In some implementations, certain steps of the methods may be combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

As will be appreciated by one skilled in the art, aspects of the present invention may be embodied as a system, method or computer program product (e.g., in the form of chip design files and/or continuity test routines). Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer-readable program code embodied thereon. For example, routines to test sets of vias for continuity may be implemented as a computer program product.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer-readable storage medium may be any tangible storage medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable signal medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood one or more blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be stored in a computer-readable storage medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As will be further appreciated, at least some of the processes in embodiments of the present invention may be implemented using any combination of software, firmware or hardware. As a preparatory step to practicing the invention in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the invention may be practiced by combining one or more machine-readable storage devices containing the code according to the present invention with appropriate processing hardware to execute the code contained therein. An apparatus for practicing the invention could be one or more processing devices and storage systems containing or having network access to program(s) coded in accordance with the invention.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method for manufacturing a three-dimensional integrated circuit, comprising:
    stacking a memory unit on a first die that includes a first computational unit, wherein the memory unit is included in a second die;
    stacking a second computational unit that is included in a third die on the second die;
    connecting sets of vertical vias that extend through the first, second, and third dies, wherein the sets of vertical vias connect components of the first and second computational units and the memory unit; and
    configuring multiplexers of the first and second computational units to selectively couple the components to different ones of the sets of vertical vias responsive to respective control words for each of the first and third dies.

2. The method of claim 1, wherein the second die includes a built-in self-test circuit that is configured to detect opens in vias of the sets of vertical vias.

3. The method of claim 1, wherein the first and second computational units each include a processor core, a floating point unit (FPU), an arithmetic logic unit (ALU), or a single instruction multiple data (SIMD) unit.

4. The method of claim 1, wherein the memory unit includes a register file.

5. The method of claim 1, wherein the first and second computational units are identical single instruction multiple data (SIMD) units or identical processor cores.

6. The method of claim 1, wherein the first and third dies include respective fuses that generate the respective control words for each of the first and third dies.

7. The method of claim 1, wherein the first and second computational units are configured to detect opens in vias of the sets of vertical vias.

8. An integrated circuit, comprising:
a first computational unit included in a first layer of the integrated circuit;
a memory unit included in a second layer of the integrated circuit that is stacked on the first layer;
a second computational unit included in a third layer of the integrated circuit that is stacked on the second layer;
sets of vertical vias that extend through the first, second, and third layers to connect components of the first and second computational units and the memory unit; and
multiplexers in each of the first and third layers, wherein the multiplexers are configured to selectively couple the components in each of the first and third layers to different ones of the sets vertical vias responsive to respective control words for each of the first and third layers.

9. The integrated circuit of claim 8, further comprising:
a built-in self-test circuit in the second layer, wherein the built-in self-test circuit is configured to detect opens in vias of the sets of vertical vias.

10. The integrated circuit of claim 8, wherein the first and second computational units each include a processor core, a floating point unit (FPU), an arithmetic logic unit (ALU), or a single instruction multiple data (SIMD) unit.

11. The integrated circuit of claim 8, wherein the memory unit includes a register file.

12. The integrated circuit of claim 8, wherein the first and second computational units are identical single instruction multiple data (SIMD) units or identical processor cores.

13. The integrated circuit of claim 8, further comprising:
respective fuses in the first and third layers, wherein the respective fuses generate the respective control words for each of the first and third layers.

14. The integrated circuit of claim 8, wherein the first and second computational units are configured to detect opens in vias of the sets of vertical vias.

15. A data processing system, comprising:
a memory; and
a processor unit coupled to the memory, wherein the processor unit includes an integrated circuit that includes:
a first computational unit included in a first layer of the integrated circuit;
a memory unit included in a second layer of the integrated circuit that is stacked on the first layer;
a second computational unit included in a third layer of the integrated circuit that is stacked on the second layer;
sets of vertical vias that extend through the first, second, and third layers to connect components of the first and second computational units and the memory unit; and
multiplexers in each of the first and third layers, wherein the multiplexers are configured to selectively couple the components in each of the first and third layers to different ones of the sets of vertical vias responsive to respective control words for each of the first and third layers.

16. The data processing system of claim 15, wherein the integrated circuit further comprises:
a built-in self-test circuit included in the second layer, wherein the built-in self-test circuit is configured to detect opens in vias of the sets of vertical vias.

17. The data processing system of claim 15, wherein the first and second computational units each include a processor core, a floating point unit (FPU), an arithmetic logic unit (ALU), or a single instruction multiple data (SIMD) unit.

18. The data processing system of claim 15, wherein the memory unit includes a register file.

19. The data processing system of claim 15, wherein the first and second computational units are identical single instruction multiple data (SIMD) units or identical processor cores.

20. The data processing system of claim 15, further comprising:
respective fuses in the first and third layers, wherein the respective fuses generate the respective control words for each of the first and third layers.

21. The data processing system of claim 15, wherein the first and second computational units are configured to detect opens in vias of the sets of vertical vias.

22. An integrated circuit, comprising:
a first computational unit included in a first layer of the integrated circuit;
a second computational unit included in a second layer of the integrated circuit that is stacked on the first layer;
sets of vertical vias that extend through the first and second layers to connect components of the first and second computational units; and
multiplexers included in each of the first and second layers, wherein the multiplexers are configured to selectively couple the components in each of the first and second layers to different ones of the sets of vertical vias responsive to respective control words for each of the first and second layers.

23. The integrated circuit of claim 22, further comprising:
a memory unit included in a third layer of the integrated circuit that is stacked between the first and second layers, wherein the set of vertical vias also extend through the third layer.

* * * * *